(12) United States Patent
Uematsu et al.

(10) Patent No.: US 8,288,852 B2
(45) Date of Patent: Oct. 16, 2012

(54) SEMICONDUCTOR DEVICE

(75) Inventors: Yutaka Uematsu, Tokyo (JP); Yukitoshi Hirose, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 232 days.

(21) Appl. No.: 12/576,672

(22) Filed: Oct. 9, 2009

(65) Prior Publication Data
US 2010/0090325 A1      Apr. 15, 2010

(30) Foreign Application Priority Data
Oct. 10, 2008   (JP) .................. 2008-263422

(51) Int. Cl.
*H01L 23/02* (2006.01)
(52) U.S. Cl. .................. 257/686; 257/E25.029
(58) Field of Classification Search .................. 257/686, 257/E25.029
See application file for complete search history.

(56) References Cited

U.S. PATENT DOCUMENTS

| | | | | |
|---|---|---|---|---|
| 5,508,563 | A * | 4/1996 | Tazawa et al. ................. | 257/773 |
| RE42,363 | E * | 5/2011 | Ellsberry et al. .............. | 257/686 |
| 2001/0008482 | A1 * | 7/2001 | Corisis et al. ................. | 361/735 |
| 2005/0051903 | A1 * | 3/2005 | Ellsberry et al. .............. | 257/777 |
| 2006/0208348 | A1 | 9/2006 | Ohsaka et al. | |
| 2007/0096292 | A1 * | 5/2007 | Machida ........................ | 257/700 |
| 2007/0096334 | A1 * | 5/2007 | Kawabata et al. ............. | 257/777 |
| 2007/0290376 | A1 * | 12/2007 | Zhao et al. ..................... | 257/787 |
| 2008/0157330 | A1 * | 7/2008 | Kroehnert et al. ............. | 257/686 |
| 2008/0224298 | A1 * | 9/2008 | Corisis et al. ................. | 257/690 |
| 2009/0057864 | A1 * | 3/2009 | Choi et al. ..................... | 257/686 |
| 2009/0102030 | A1 * | 4/2009 | Khan et al. .................... | 257/675 |
| 2009/0152740 | A1 * | 6/2009 | Park et al. ..................... | 257/778 |
| 2009/0161402 | A1 * | 6/2009 | Oh et al. ........................ | 365/51 |

FOREIGN PATENT DOCUMENTS
JP         2006295136         10/2006
* cited by examiner

*Primary Examiner* — Kiesha Bryant
*Assistant Examiner* — Igwe U Anya
(74) *Attorney, Agent, or Firm* — Young & Thompson

(57) ABSTRACT

In order to solve a problem of increased noise accompanying increased area of a return path in a stacked package structure, provided is a semiconductor device which is formed in a stacked package such as a PoP package, which realizes low noise without changing a package size. An additional power supply wiring that runs along a signal wiring between an upper PoP and a lower PoP is newly added in the lower PoP of a package having a PoP structure.

14 Claims, 7 Drawing Sheets

SEMICONDUCTOR DEVICE

This application is based upon and claims the benefit of priority from Japanese patent application No. 2008-263422, filed on Oct. 10, 2008, the disclosure of which is incorporated herein in its entirety by reference.

BACKGROUND OF THE INVENTION

1. Field of the Invention

This invention relates to a semiconductor device, and more particularly, to a semiconductor device which has a stacked structure of semiconductor encapsulated packages to realize high-density mounting of semiconductor integrated circuit devices. Herein, it is to be noted in the instant specification that the term "semiconductor package" often means a semiconductor device which encapsulates semiconductor integrated circuit device or devices.

2. Description of the Related Art

The inventor has studied, for example, the following technologies for such a semiconductor package.

As generations of large scale integrated circuits (LSIs) of the semiconductor device have been advanced, it has become increasingly difficult to design an integrated circuit of a low power noise. This is attributed to an increase in power noise, which results from increases in consumed current amount and high speed of a semiconductor element for high-speed processing function. In addition, a reduction in noise margin is also caused to occur due to a reduction in source voltage accompanying the progress in the semiconductor process.

Meanwhile, in recent years, a reduction in size and an increase in functionality of electronic devices typified by a cellular phone have been advanced, and there is an increased demand for a stacked semiconductor package with a three-dimensional arrangement in which a memory and a controller LSI are encapsulated in a single package (PKG). In this kind of packaged or encapsulated product, LSIs to which a current is to be supplied (or which consume current) are increased in number. In spite of the fact, a number of solder balls (ball grid array balls, hereinafter, abbreviated as BGA balls) for electrically connecting a printed circuit board (hereinafter, abbreviated as PCB) and the package remains substantially unchanged, and hence the power noise becomes more problematic than before. In particular, the problem becomes apparent in an LSI located in an upper layer of the stack, which is electrically distant from the PCB.

To address the above-mentioned problem, for example, Japanese Unexamined Patent Application Publication (JP-A) No. 2006-295136 proposes a package on package (PoP) structure in which packages are stacked three-dimensionally so that an area of a PoP package provided on an upper side (hereinafter, abbreviated as upper PoP package) is larger than an area of a PoP package provided on a lower side (hereinafter, abbreviated as lower PoP package). In this event, BGA balls for directly supplying current from a PCB are arranged on a periphery of the upper PoP package. This arrangement makes it possible to realize an increase in power supply property to an LSI on the upper PoP package.

One kind of the power noise addressed herein is simultaneous switching noise (hereinafter, abbreviated as SSN) generated when a large number of I/O circuits of the LSI are switched simultaneously. The SSN includes off-chip SSN generated when potential variation occurs due to a current for transferring signals between chips. The off-chip SSN is generated when a transient current is caused to flow in a loop of a power (or ground) wiring and a signal wiring, which connects a driver and a receiver. A voltage value of the noise is determined as a product of a transient current component di/dt, and effective loop inductance (effective inductance: Leff) between the power (ground) wiring and the signal wiring. Therefore, a general method for suppressing the noise involves designing the wirings so that the effective inductance is minimized in the LSI package (PKG) and the PCB. Specifically, the signal wiring and the power/ground wiring are designed to be as close as possible to each other inside the PKG and the PCB, to thereby reduce a loop area of a current path.

Incidentally, the inventor has studied the stacked package semiconductor device as described above to find the following fact.

That is, the power wiring to the LSI mounted on the upper PoP package and the power wiring to the LSI mounted on the lower PoP package are independent to each other inside the lower PoP package. This results in an increased loop area of the current path formed by the power wiring and the signal wiring for transmitting signals between the upper PoP package and the lower PoP package, to thereby significantly increase the above-mentioned off-chip SSN.

Herein, although no detailed analysis has thus far been made about such an off-chip SSN, the off-chip SSN will be described by simply and temporarily referring to an example of a PoP system illustrated in FIGS. 2 and 3 for convenience of description.

The illustrated PoP system has memories (DRAM or flash) 5-1 and 5-2 mounted on an upper PoP 2, and a microcomputer 6 which has a memory controller function and which is mounted on a lower PoP 3. With this structure, signal wirings for transferring signals between memory controller LSIs and the other elements are wired only within the PoP package. In this case, the signal wirings are wired on both the upper PoP 2 and the lower PoP 3 so that the LSIs are connected to each other via a shortest path. In the example illustrated in FIG. 2, current paths are structured by a current path 13 (shown by a dotted line) for signals and a current path 14 (also shown by a dotted line) to a power supply system. Herein, the current path 14 which serves as a return path for the signal current is given from the PCB 1 to the upper PoP2 and the lower PoP3 independently. As a result, a loop area formed by the paths 13 and 14 is increased, which leads to an increase in effective inductance, and hence to an increase in noise. This is expressed as an equivalent circuit illustrated in a schematic diagram of FIG. 3.

SUMMARY OF THE INVENTION

This invention has been made in view of the above, and this invention seeks to provide technology for reducing power noise even in a semiconductor device which has the above-mentioned PoP package structure and which may be called a semiconductor package.

According to this invention, there is provided a semiconductor device or package having a PoP structure, in which a power supply wiring is newly added to a lower PoP package, the power supply wiring running parallel to signal wirings between an upper PoP package and the lower PoP package.

More specifically, in one embodiment, there is provided a semiconductor device, comprising a first semiconductor package encapsulating a first semiconductor integrated circuit, a second semiconductor package encapsulating a second semiconductor integrated circuit having a different function than a function of the first semiconductor integrated circuit and a printed circuit board, wherein the first semiconductor package is mounted on the printed circuit board, wherein the second semiconductor package is stacked and mounted on the first semiconductor package, and wherein the first semiconductor package comprises a first power supply wiring connecting a power supply path of the first semiconductor integrated circuit and a power supply path of the printed circuit board, and a second power supply wiring connecting a power supply path of the second semiconductor package and the power supply path of the printed circuit board. The semiconductor device further comprises a third power supply wiring connecting the first power supply wiring and the second power supply wiring.

Effects obtained by a typical one of the embodiments disclosed herein are briefly described as follows:

(1) Noise is reduced without changing cost and size of the package; and (2) A signal transfer rate and processing performance in the PoP are increased with the increase in signal quality of item (1).

BRIEF DESCRIPTION OF THE DRAWINGS

The above features and advantages of this invention will be more apparent from the following description of certain embodiments taken in conjunction with the accompanying drawings, in which.

DETAILED DESCRIPTION OF THE PREFERRED EMBODIMENTS

Figure 1:
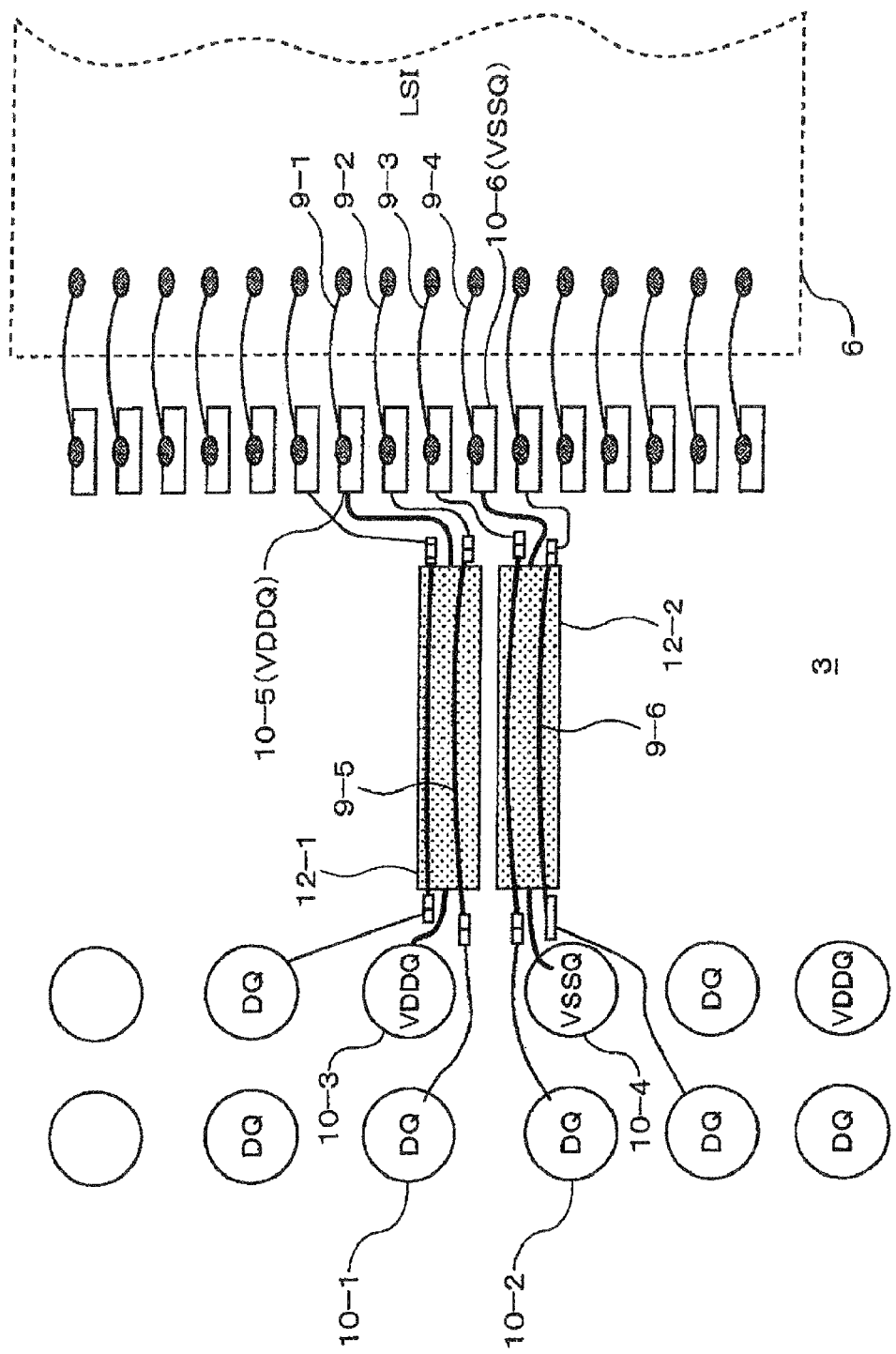
FIG. 1 is an explanatory view illustrating a third embodiment of this invention.

Hereinafter, embodiments of this invention are described in detail with reference to the accompanying drawings. Note that throughout the drawings for describing the embodiments, the same parts are represented by the same reference numerals and symbols in principle, and duplicate description thereof is omitted.

In order to clarify the features of this invention, this invention is described in comparison with the related art on which this invention is based and which has been described above in Description of the Related Art.

<Related Art on which the Invention is Based>

Figure 2:
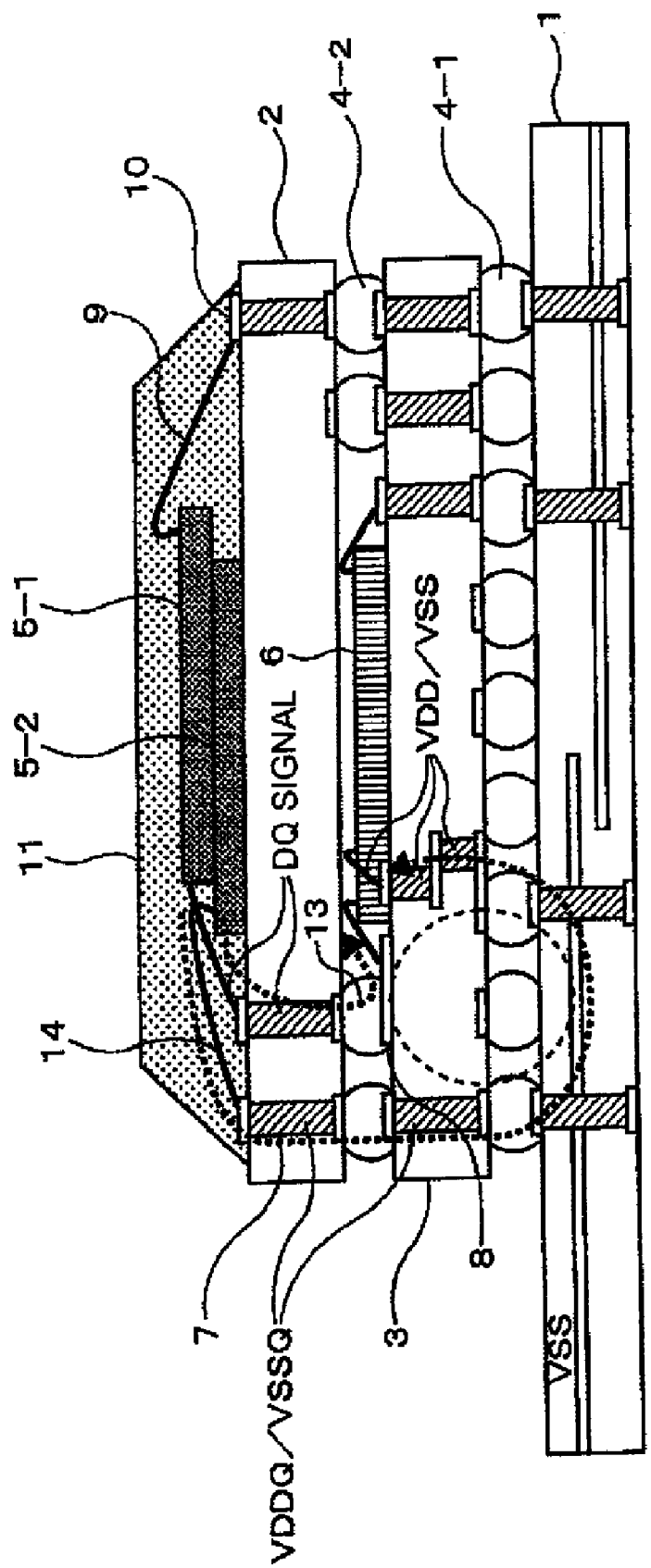
FIG. 2 is a view illustrating a conventional PoP structure.

FIG. 2 illustrates a PoP package (namely, a semiconductor device) according to the related art on which this invention is based. In FIG. 2, reference numeral 1 denotes a printed circuit board (PCB); 2, a PoP package on an upper side (upper PoP); 3, a PoP package on a lower side (lower PoP); 4-1, a BGA ball for electrically connecting the PCB and the lower PoP; 4-2, a BGA ball for electrically connecting the upper PoP and the lower PoP; 5-1 and 5-2, memory LSIs such as dynamic random access memories (DRAMs); 6, a controller LSI for controlling an operation of the memory LSIs; 7, a through hole (or via hole) for electrically connecting layers inside the package; 8, an inner-package wiring; 9, a wire bonding; 10, an electrode; and 11, a molded resin. This example shows a PoP in which two packages are stacked, but more packages may be stacked.

The memory LSIs 5 on the upper PoP 2 may be called a first semiconductor integrated circuit while the controller LSI 6 on the lower PoP 3 my be called a second semiconductor integrated circuit.

Figure 3:
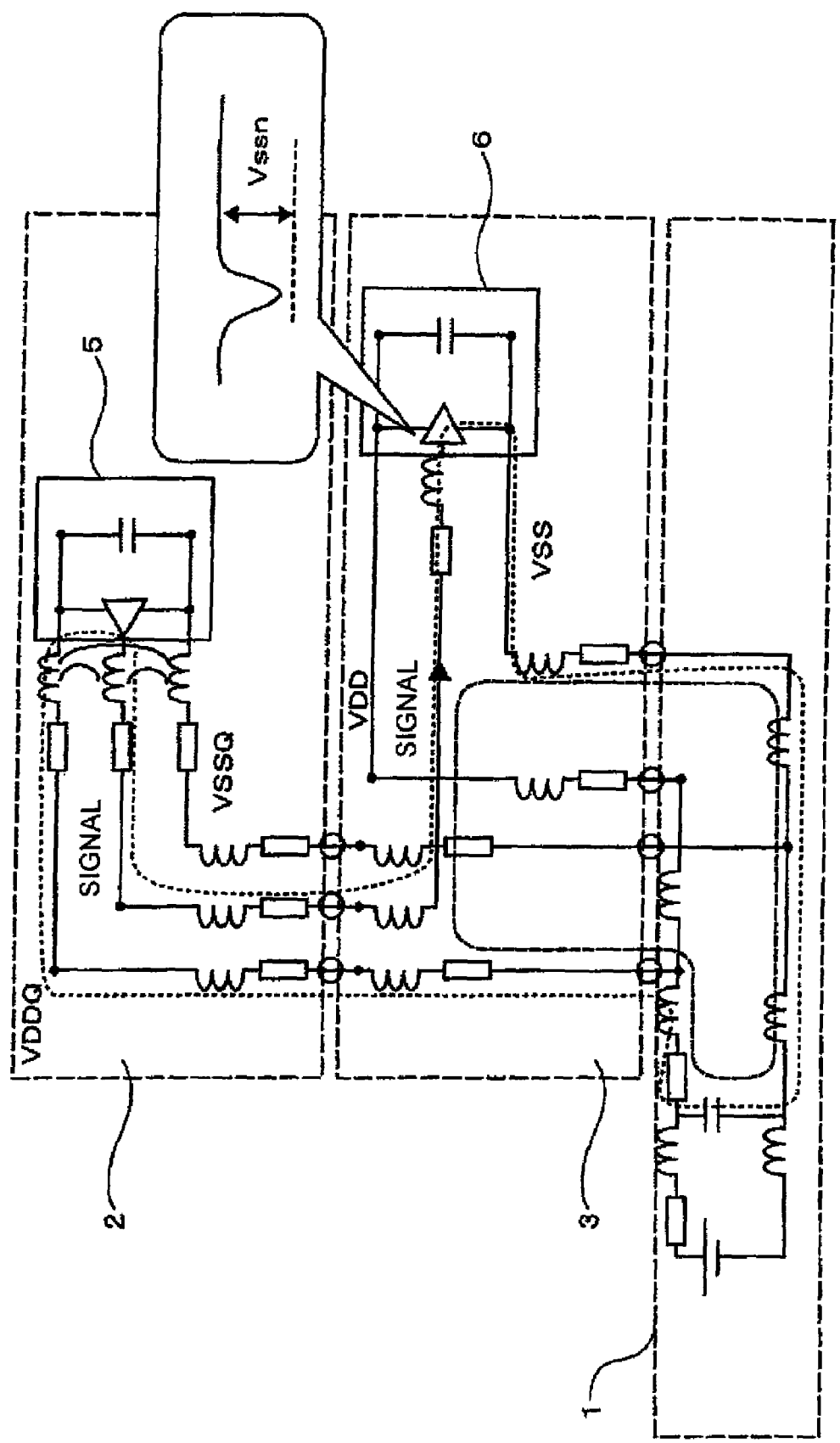
FIG. 3 is a view illustrating a simple equivalent circuit of the conventional PoP structure of FIG. 2.

A power supply system of the printed circuit board (PCB) as an example of the related art may be expressed as a simple electrically equivalent circuit as in FIG. 3. For simplicity, among a number of signal wirings and power supply wirings, only one data signal wiring and one power/ground wiring are illustrated.

In this case, a current path for transferring signals between the memory 5 and the controller LSI 6 allows a current to flow through a shortest signal wiring connecting the memory 5, which serves as a driver circuit, and the controller LSI 6, which serves as a receiver circuit as illustrated in FIG. 2, and another current path allows a return current to flow from the controller LSI side to the PCB and then from the PCB to the upper PoP. As a result, a loop area formed by the signal path and the return path is increased. Therefore, effective inductance Leff between the signal path and the power supply path is increased, and hence off-chip SSN (Vssn), which is a noise in a proportional relationship with Leff, is increased. In FIG. 3, the power supply wiring which connects a power supply path of the first semiconductor integrated circuit (namely, memory LSIs) on the upper PoP 2 to a power supply path of the printed circuit board (PCB) may be referred to as a first power supply wiring. On the other hand, the power supply wiring which connects a power supply path of the second semiconductor integrated circuit (namely, controller LSI) to a power supply path of the PCB may be referred to as a second power supply wiring which forms a loop smaller than that of the first power supply wiring.

First Embodiment

Figure 4:
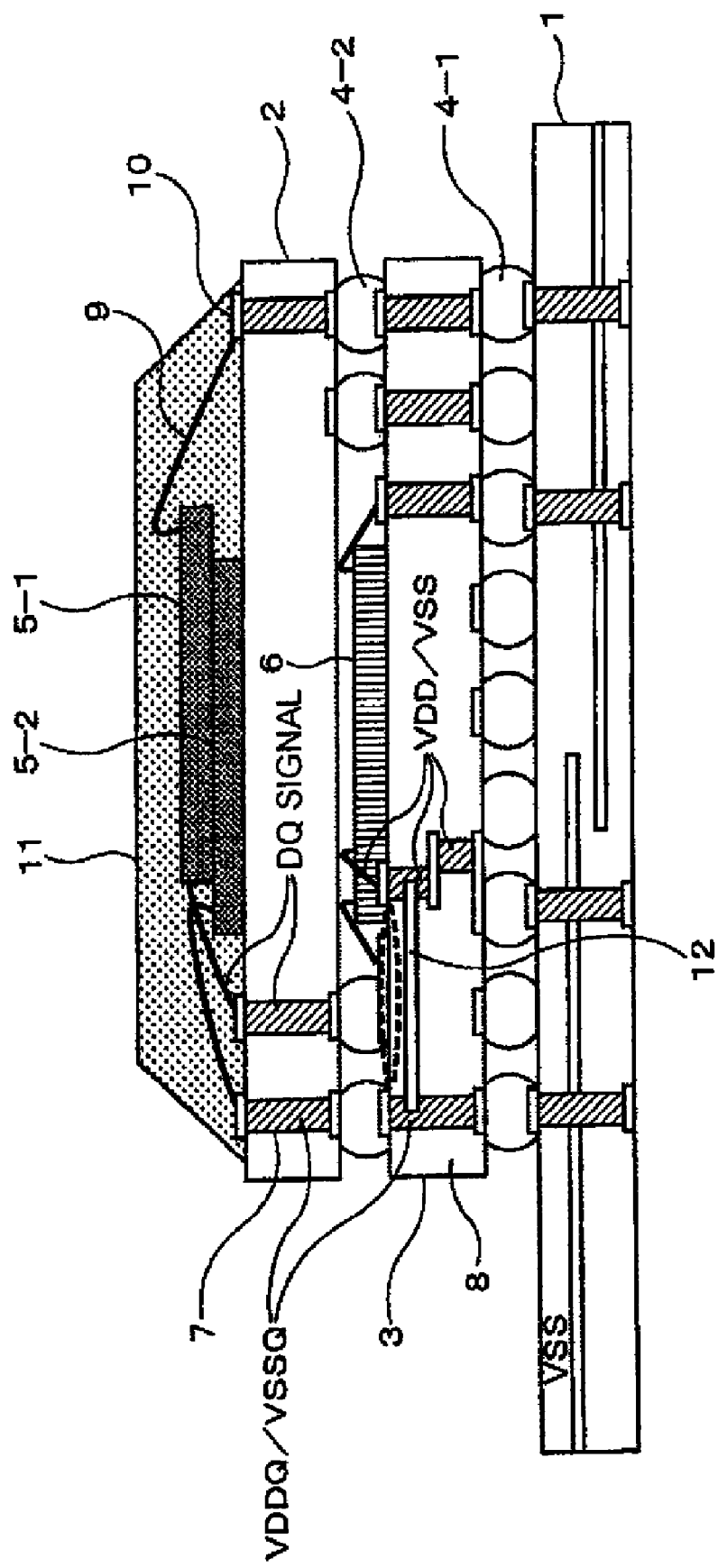
FIG. 4 is a view illustrating a PoP structure according to a first embodiment of this invention.

FIG. 4 is a view illustrating a structure of a semiconductor device, namely, a semiconductor package according to a first embodiment of this invention.

First, with reference to FIG. 4, an example of the structure of the semiconductor device according to the first embodiment is described. The structure of the semiconductor device according to the first embodiment is similar to the semiconductor device illustrated in FIG. 2 except that an additional wiring 12 is provided in the lower PoP 3. This additional wiring 12 connects two power supply wirings of the lower PoP 3, one of which is a power supply wiring (namely, the first power supply wiring) from the PCB 1 to the upper PoP 2 and another one of which is a power supply wiring (namely, the second power supply wiring) from the PCB 1 to a memory controller LSI 6 mounted on the lower PoP 3. The illustrated semiconductor package is featured by an additional power supply wiring placed in the vicinity of the signal wiring between the upper PoP 2 and the lower PoP 3. The additional wiring may be called a third power supply wiring.

Figure 5:
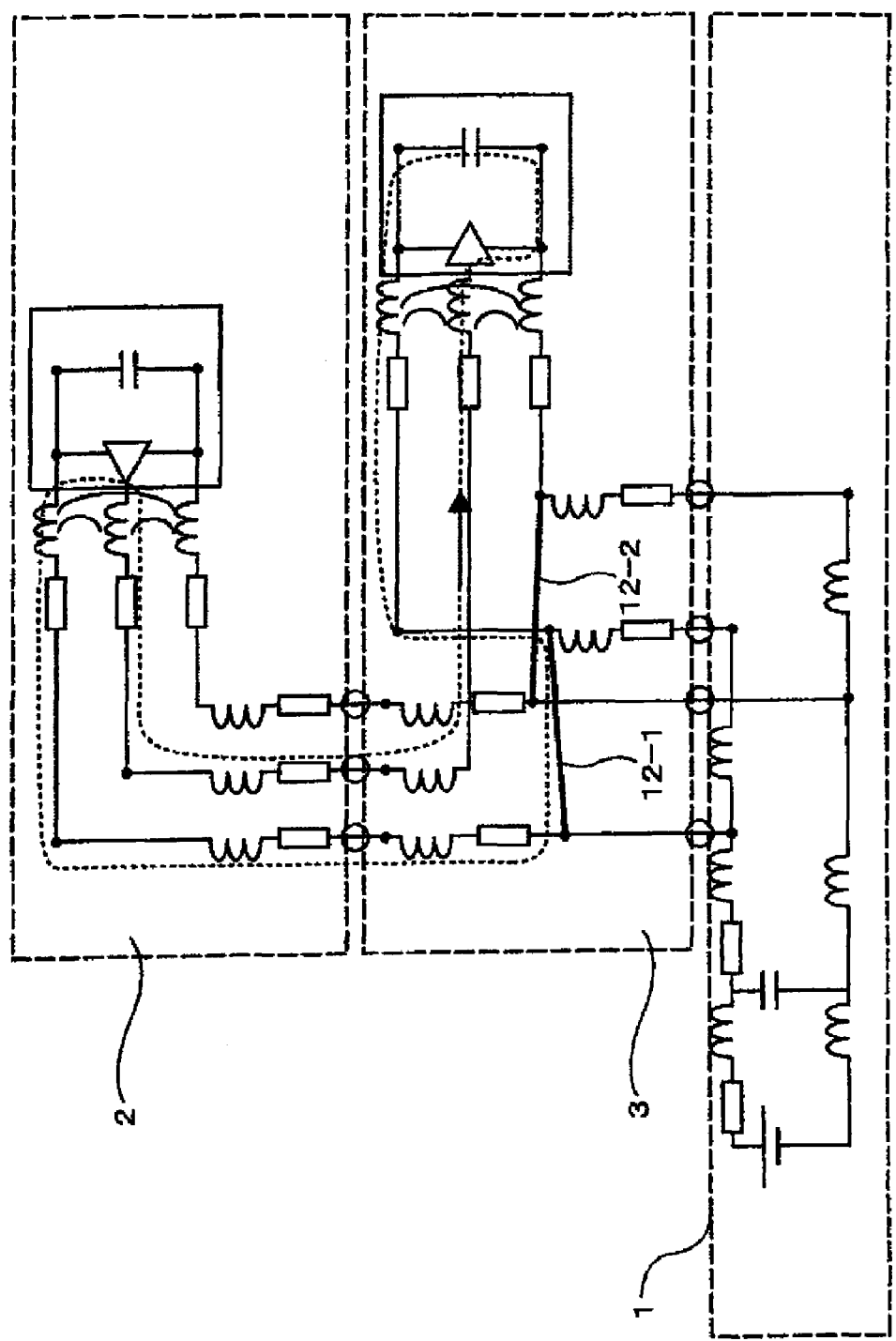
FIG. 5 is a view illustrating a simple equivalent circuit of the PoP structure according to the first embodiment of this invention.

This structure may reduce Leff, which has conventionally been a problem, to as small as $\frac{1}{10}$ or less. This proportion depends on the ratio of loop areas when a general PoP package is considered. An equivalent circuit of this structure is illustrated in FIG. 5.

The first embodiment shows a case where the additional wiring 12 is wired in a layer adjacent to the signal wiring layer. In this case, an interval between the signal wiring and the additional power supply wiring is approximately the same as a thickness of a dielectric material of the package substrate, and hence may be as close as 100 μm or less.

Second Embodiment

Figures 6A, 6B:
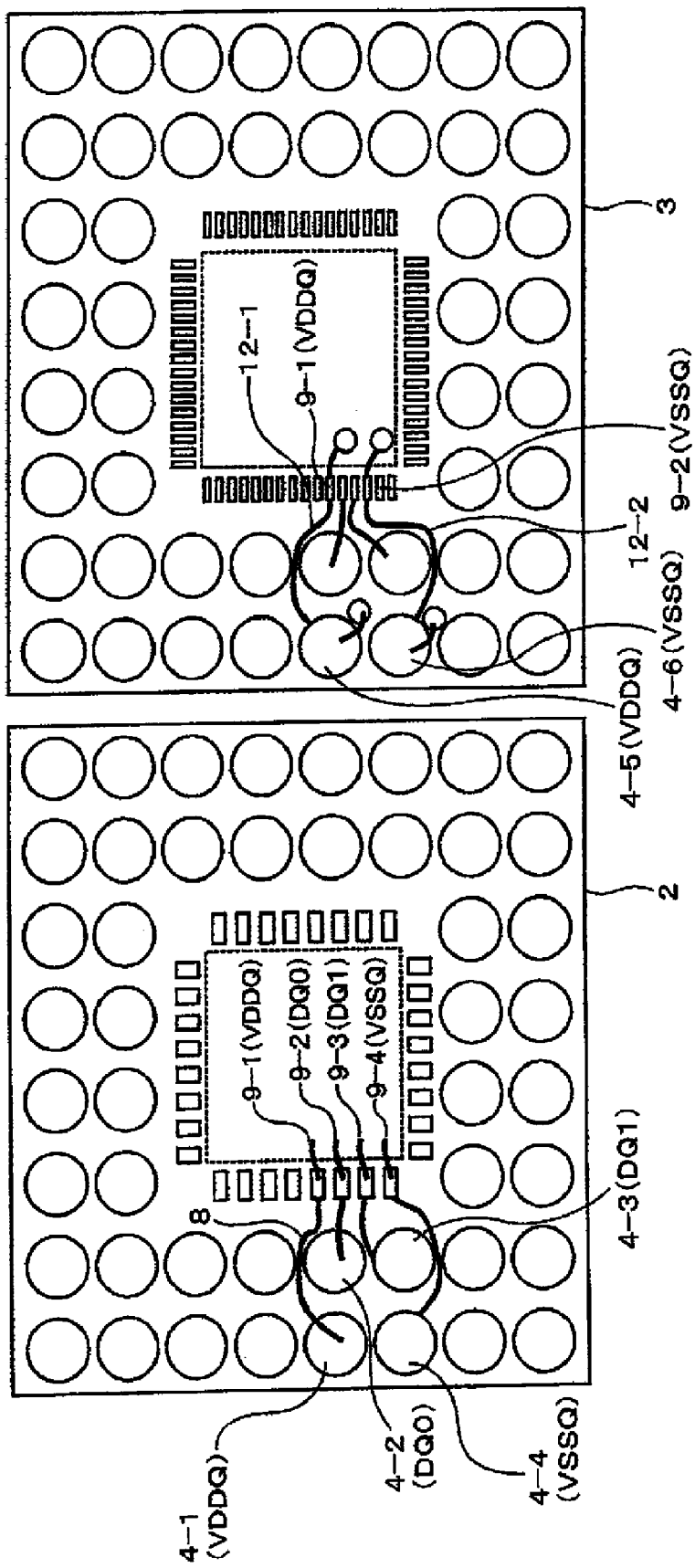
FIGS. 6A and 6B are top views of an upper PoP and a lower PoP according to a second embodiment of this invention, respectively.

FIGS. 6A and 66 are views for illustrating a package wiring structure of a semiconductor package according to a second embodiment of this invention.

FIGS. 6A and 6B are top views of an upper PoP 2 and a lower PoP 3, respectively.

Figures 7A, 7B:
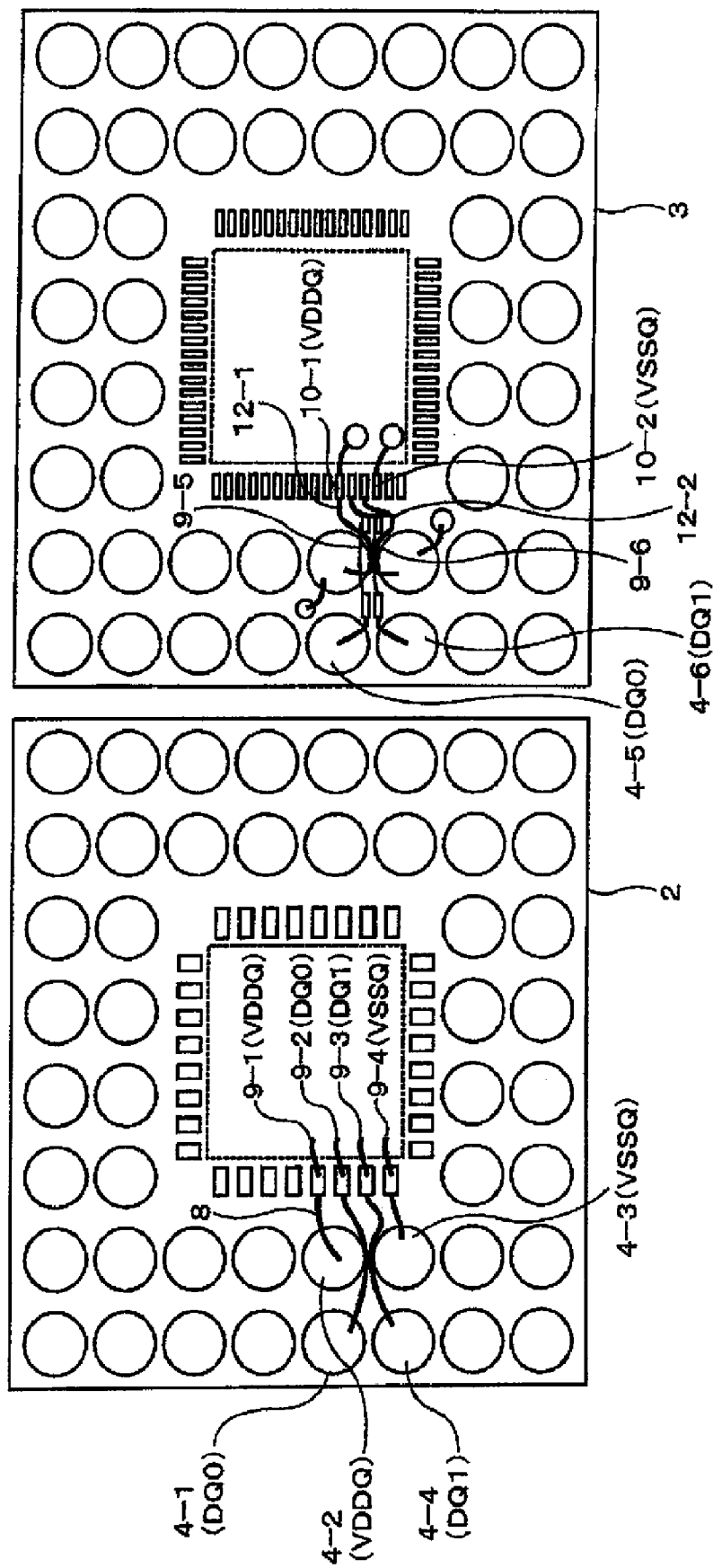
FIGS. 7A and 7B are top views of an upper PoP and a lower PoP according to a third embodiment of this invention, respectively.

The entire structure of a semiconductor package according to the second embodiment is similar in structure to illustrated in FIG. 4 except that additional power supply wirings 12-1 and 12-2 are wired adjacent to each other in the same layer as signal wirings between the upper PoP 2 and the lower PoP 3. As shown in FIG. 7(b), the additional power supply wirings 12-1 and 12-2 are arranged on the lower PoP 3.

In this case, the wirings may be provided as close as a line and within a range permitted by a space (L/S) rule of the package substrate. Practically, the wirings provided at intervals of 50 μm/50 μm may be realized. This embodiment is effective when a sufficient mounting space is left in the signal wiring layer to mount the additional wirings 12-1, 12-2.

Third Embodiment

FIGS. 7A and 7B are views for illustrating a package wiring structure of a semiconductor package according to a third embodiment of this invention.

The entire structure of the semiconductor device according to the third embodiment is also similar to those illustrated in FIGS. 4, 6A, and 6B except that the additional wirings 12-1 and 12-2 are wired on a top layer of the lower PoP 3, and that the signal wirings between the upper PoP 2 and the lower PoP 3 are air-wired directly above the additional power supply wirings 12-1 and 12-2 using wire bonded portions 9-5 and 9-6, as illustrated in FIG. 7B. In other words, the surface of the signal wirings located over the lower PoP 3 are spaced apart from the additional power supply wirings 12-1 and 12-2 laid on the lower PoP 3.

Now, the structure of the lower PoP 3 illustrated in FIG. 7 is described in detail with reference to FIG. 1. FIG. 1 is a partially-enlarged view of features of the semiconductor package according to the third embodiment illustrated in FIGS. 7A and 7B. It is noted in FIG. 1 that wirings and the like not necessary for description are all omitted. In FIG. 1, reference numerals 10-1 to 10-4 are BGA ball electrodes for connection with the upper PoP 2. Reference numerals 10-5 and 10-6 are electrodes for bonding wires 9-1 to 9-4 for connecting the wirings of the lower PoP 3 and electrodes of the LSI. The structure has features in that the power supply electrodes (VDDQ and VSSQ) 10-3 and 10-4 of the electrodes for connection with the upper PoP 2, and the chip wire bonding electrodes 10-5 and 10-6 are wired adjacent to each other over the additional power supply wirings 12-1 and 12-2, and in that the signal wirings are connected via bonding wires 9-1 to 9-4. In this case, the bonding wires 9-1 to 9-4 are preferably provided as close as possible to the additional power supply wirings 12-1 and 12-2, and are connected by a preferred wire bonding method of low loop bonding. With this method, mounting at a low height of 50 μm or less may be realized. Advantages of using the semiconductor package according to the third embodiment are as follows:

1. The loop between the signal path and the power supply path may be minimized even for high-density wirings;
2. The proportion of the signal wirings and the power supply wirings is generally about 2:1, and hence the power supply wirings may be located at a wiring width of twice or more in comparison with a usual wiring width of signal wirings. Therefore, both the power inductance and Leff may be reduced; and
3. The wire bonding is a low-cost mounting technology and has a small cost impact.

Hereinabove, the invention made by the inventor has thus far been described in detail with reference to the embodiments. However, this invention is not limited to the embodiments described above, and it should be understood that various modifications may be made without departing from the spirit thereof. In addition, the first to third embodiments may be combined as appropriate. Further, this invention has been described for PoP, but it should be understood that this invention may be equally applied to other package forms such as system in package (SiP).

This invention may be applied to a semiconductor device for which both a small area and low power noise are required, a printed circuit board on which the semiconductor device is mounted, and the like.

What is claimed is:

1. A device, comprising:
a first semiconductor package encapsulating a first semiconductor integrated circuit;
a second semiconductor package encapsulating a second semiconductor integrated circuit having a different function than a function of the first semiconductor integrated circuit; and a printed circuit board;
wherein the first semiconductor package is mounted on the printed circuit board:
wherein the second semiconductor package is stacked and mounted on the first semiconductor package: and
wherein the first semiconductor package comprises:
a first power supply wiring connecting a power supply path of the first semiconductor integrated circuit and a power supply path of the printed circuit board; and
a second power supply wiring connecting a power supply path of the second semiconductor package and the power supply path of the printed circuit board,
the device further comprising:
a third power supply wiring connecting the first power supply wiring and the second power supply wiring; and
transfer signal wirings which are provided within the stacked package as intra-package transfer signal wirings and which transmit and receive a data signal between the first semiconductor integrated circuit and the second semiconductor integrated circuit,
the intra-package transfer signal wirings comprising:
a first signal wiring which is provided in the first semiconductor package; and
a second signal wiring which is provided in the second semiconductor package and which is electrically connected to the first signal wiring;
wherein:
the first semiconductor package comprises a plurality of wiring layers;
the third power supply wiring is provided in a top layer of the plurality of wiring layers of the first semiconductor package in which the first semiconductor integrated circuit is mounted;
the first signal wiring is air-wired directly above the third power supply wiring through a wire bonding; and
the third power supply wiring and the first signal wiring are wired so as to face each other.

2. A device, comprising:
a first semiconductor package that comprises:

a first semiconductor integrated circuit, a first wiring configured to receive a first power voltage, the first wiring being further configured to be electrically connected to the first semiconductor integrated circuit to convey the first power voltage to the first semiconductor integrated circuit, and a second wiring provided independently of and apart from the first wiring, the second wiring being configured to receive the first power voltage in parallel to the first wiring receiving the first power voltage; and a second semiconductor package that comprises:

a second semiconductor integrated circuit, and a third wiring configured to be electrically connected to the second wiring of the first semiconductor package to receive the first power voltage, the third wiring being further configured to be electrically connected to the second semiconductor integrated circuit to convey the first power voltage to the second semiconductor integrated circuit;

the first semiconductor package further comprising a fourth wiring that is configured to connect the first and second wirings to each other.

3. The device as claimed in claim 2, further comprising a printed circuit board, the first semiconductor package being mounted on the printed circuit board, and the second semiconductor package being stacked over the first semiconductor package.

4. The device as claimed in claim 3, wherein the printed circuit board comprises a fifth wiring configured to receive the first power voltage and a sixth wiring configured to receive the first power voltage, the first wiring of the first semiconductor package being electrically connected to the fifth wiring and the second wiring of the first semiconductor package being electrically connected to the sixth wiring.

5. The device as claimed in claim 2, wherein the first wiring comprises a first conductive through hole and a first bonding wire connecting the first conductive through hole to the first semiconductor integrated circuit, the second wiring comprising a second conductive through hole, and the third wiring comprises a third conductive through hole and a second boding wire connecting the third conductive though hole to the second semiconductor integrated circuit.

6. The device as claimed in claim 5, wherein the fourth wiring comprises a conductive path embedded in the first semiconductor package.

7. The device as claimed in claim 5, wherein the fourth wiring comprises a third bonding wire connecting the first and second wirings to each other.

8. The device as claimed in claim 2, wherein the first semiconductor package further comprises:

a fifth wiring configured to receive a second power voltage that is different in level from the first power voltage, the fifth wiring being further configured to be electrically connected to the first semiconductor integrated circuit to convey the second power voltage to the first semiconductor integrated circuit, and a sixth wiring provided independently of and apart from the fifth wiring, the sixth wiring being configured to receive the second power voltage in parallel to the fifth wiring receiving the second power voltage; and the second semiconductor package further comprises:

a seventh wiring configured to be electrically connected to the sixth wiring of the first semiconductor package to receive the second power voltage, the seventh wiring being further configured to be electrically connected to the second semiconductor integrated circuit to convey the second power voltage to the second semiconductor integrated circuit, and an eighth wiring configured to connect the fifth and sixth wirings to each other.

9. The device as claimed in claim 8, further comprising a printed circuit board, the first semiconductor package being mounted on the printed circuit board, and the second semiconductor package being stacked over the first semiconductor package.

10. The device as claimed in claim 9, wherein the printed circuit board comprises a ninth wiring configured to receive the first power voltage, a tenth wiring configured to receive the first power voltage, an eleventh wiring configured to receive the second power voltage and a twelfth wiring configured to receive the second power voltage, the first wiring of the first semiconductor package being electrically connected to the ninth wiring, the second wiring of the first semiconductor package being electrically connected to the tenth wiring, the fifth wiring of the first semiconductor package being electrically connected to the eleventh wiring, and the sixth wiring being electrically connected to the twelfth wiring.

11. The device as claimed in claim 10, wherein the ninth and tenth wirings are connected to each other through a first conductive path and the eleventh and twelfth wirings are connected to each other through a second conductive path.

12. The device as claim in claim 2, wherein the first semiconductor package further comprising:

a plurality of first signal wirings each configured to be electrically connected to the first semiconductor integrated circuit, and a plurality of second signal wirings each provided independently of and apart from the first signal wirings; and the second semiconductor package further comprises:

a plurality of third signal wirings each configured to be electrically connected to the second semiconductor integrated circuit and to an associated one of the second signal wirings.

13. The device as claimed in claim 12, further comprising a printed circuit board, the first semiconductor package being mounted on the printed circuit board, and the second semiconductor package being stacked over the first semiconductor package.

14. The device as claimed in claim 13, wherein the printed circuit board comprises a fifth wiring configured to receive the first power voltage and to be electrically connected to the first wiring, a sixth wiring configured to receive the first power voltage and to be electrically connected to the second wiring, a plurality of fourth signal wirings each configured to be electrically connected to an associated one of the first signal wirings, and a plurality of fifth signal wirings each configured to be electrically connected to an associated one of the second signal wirings.

\* \* \* \* \*